(12) United States Patent
Gusikhin et al.

(10) Patent No.: US 7,146,579 B2
(45) Date of Patent: Dec. 5, 2006

(54) VRML INTERFACE SOFTWARE FOR IMAGE AND DATA COMPILATION

(75) Inventors: Oleg Yurievich Gusikhin, W. Bloomfield, MI (US); Rexanne Michelle Owen, Canton, MI (US); Charles F. Schweitzer, South Lyon, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 722 days.

(21) Appl. No.: 10/023,075

(22) Filed: Dec. 13, 2001

(65) Prior Publication Data

US 2003/0115567 A1     Jun. 19, 2003

(51) Int. Cl.
*G06F 17/50* (2006.01)
*G06F 3/00* (2006.01)
*G06F 9/45* (2006.01)

(52) U.S. Cl. .......................... 716/1; 715/764; 717/141
(58) Field of Classification Search .............. 716/1–15; 382/233; 345/589; 709/206; 707/1
See application file for complete search history.

(56) References Cited

U.S. PATENT DOCUMENTS

| | | | |
|---|---|---|---|
| 5,878,408 A * | 3/1999 | Van Huben et al. ............ 707/1 |
| 6,362,817 B1 * | 3/2002 | Powers et al. .............. 345/419 |
| 6,578,174 B1 * | 6/2003 | Zizzo ............................. 716/1 |
| 6,665,854 B1 * | 12/2003 | Fujiwara et al. .............. 716/15 |
| 2002/0041287 A1 * | 4/2002 | Engeldrum et al. ......... 345/589 |
| 2003/0098881 A1 * | 5/2003 | Nolte et al. ................. 345/764 |

OTHER PUBLICATIONS

'Smart Virtual Prototypes: Distributed 3D Product Simulations for Web Based Environments', by Marko Salmela, Harri Kyllonen, Proceeding s of the fifth symposium on Virtual Reality Modeling Language, Feb. 2000.*

* cited by examiner

*Primary Examiner*—Wei Zhen
*Assistant Examiner*—Chih-Ching Chow
(74) *Attorney, Agent, or Firm*—Thomas E. Donohue; Artz & Artz, P.C.

(57) ABSTRACT

A method to compile images and data created on different software platforms into a platform-independent image begins when a PCB assembler utilizes a VRML interface to make a request to show an image of a PCB or any part of a PCB. The request is sent to a WWW server, which in turn, contacts a database interface, such as CGI. The requested image data is stored on at least one external database and is likely comprised of many individual elements created on many different software platforms, such as Gerber or CAD. The database interface retrieves the requested image data from the external databases and funnels it to the PCB assembler via the WWW server. Finally, the VRML interface software compiles all of the multi-platform data and generates a new, software- and processor-independent image.

17 Claims, 1 Drawing Sheet

VRML INTERFACE SOFTWARE FOR IMAGE AND DATA COMPILATION

TECHNICAL FIELD

The present invention relates generally to database interfaces, and more particularly, to VRML interface software.

BACKGROUND ART

Widespread use of computers and other electronic devices has fueled the growth of printed circuit board (PCB) production. Like others who fabricate mass-produced items, PCB manufacturers continually seek to lower production costs while increasing the functionality, quality and reliability of their products.

Before a PCB design is manufactured, an assembler will often compose a complete layout drawing of the PCB that includes items such as electronic components or the location of traces on tbe board. Often a PCB assembler must gather this assembly information from many sources. For example, the board traces may be located on an image file residing in one database while the microchip package type images reside in a second database. In addition, the assembly information may be created using different software packages, such as Gerber or CAD. Thus, in order to create a layout drawing, the PCB assembler must first locate all of the image files and then translate the image files from their software-specific platforms to a neutral file format. Not only is this translating step time consuming, but often the translations themselves are error-prone. The PCB assembler cannot rely on the accuracy of the data he receives once translated.

Because of the disadvantages of the prior art, it is apparent that a new method to compile information from image and data files created on differing software platforms is needed. This new method should adequately gather all of the information the PCB assembler requires to create a PCB layout drawing. The new method should also improve the accuracy of the data the assembler receives and should reduce the amount of time needed to gather the assembly data, thereby reducing overall manufacturing costs. The present invention is directed to meeting those ends.

SUMMARY OF THE INVENTION

One object of the invention is to utilize VRML interface software to compile images and data created on different software platforms into a platform-independent image. Another object of the invention is to provide an improved method to manufacture printed circuit boards (PCB). A third object of the invention is to reduce costs associated with manufacturing PCBs.

In one aspect of the invention, a method to compile images and data created on different software platforms into a platform-independent image begins when a PCB assembler logs onto the World Wide Web (WWW) by using a web browser loaded with VRML interface software. Once logged on, the assembler can use the VRML interface to make a request to show an image of a PCB or any part of a PCB. The request is sent to the WWW server, which in turn, contacts a database interface, such as CGI. The requested image data is stored on at least one external database and is likely comprised of many individual elements created on many different software platforms, such as Gerber or CAD. The database interface retrieves the requested image data from the external databases and funnels it to the PCB assembler via the WWW server. Finally, the VRML interface software compiles all of the multi-platform data and generates a new, software- and processor-independent image.

The present invention thus achieves a new method to generate a software and processor independent image based on several other software dependent images. The present invention is advantageous because it provides a reliable method to generate viewable images independent of computer processor type. The present invention also reduces costs associated with PCB manufacturing because the amount of time a PCB assembler spends assembling data is reduced and the amount of PCB test panels needed to confirm correct PCB assembly is also reduced.

Additional advantages and features of the present invention will become apparent from the description that follows and may be realized by means of the instrumentalities and combinations particularly pointed out in the appended claims, taken in conjunction with the accompanying drawings.

BRIEF DESCRIPTION OF THE DRAWINGS

In order that the invention may be well understood, there will now be described some embodiments thereof, given by way of example, reference being made to the accompanying drawing, in which.

BEST MODE(S) FOR CARRYING OUT THE INVENTION

Figure 1:
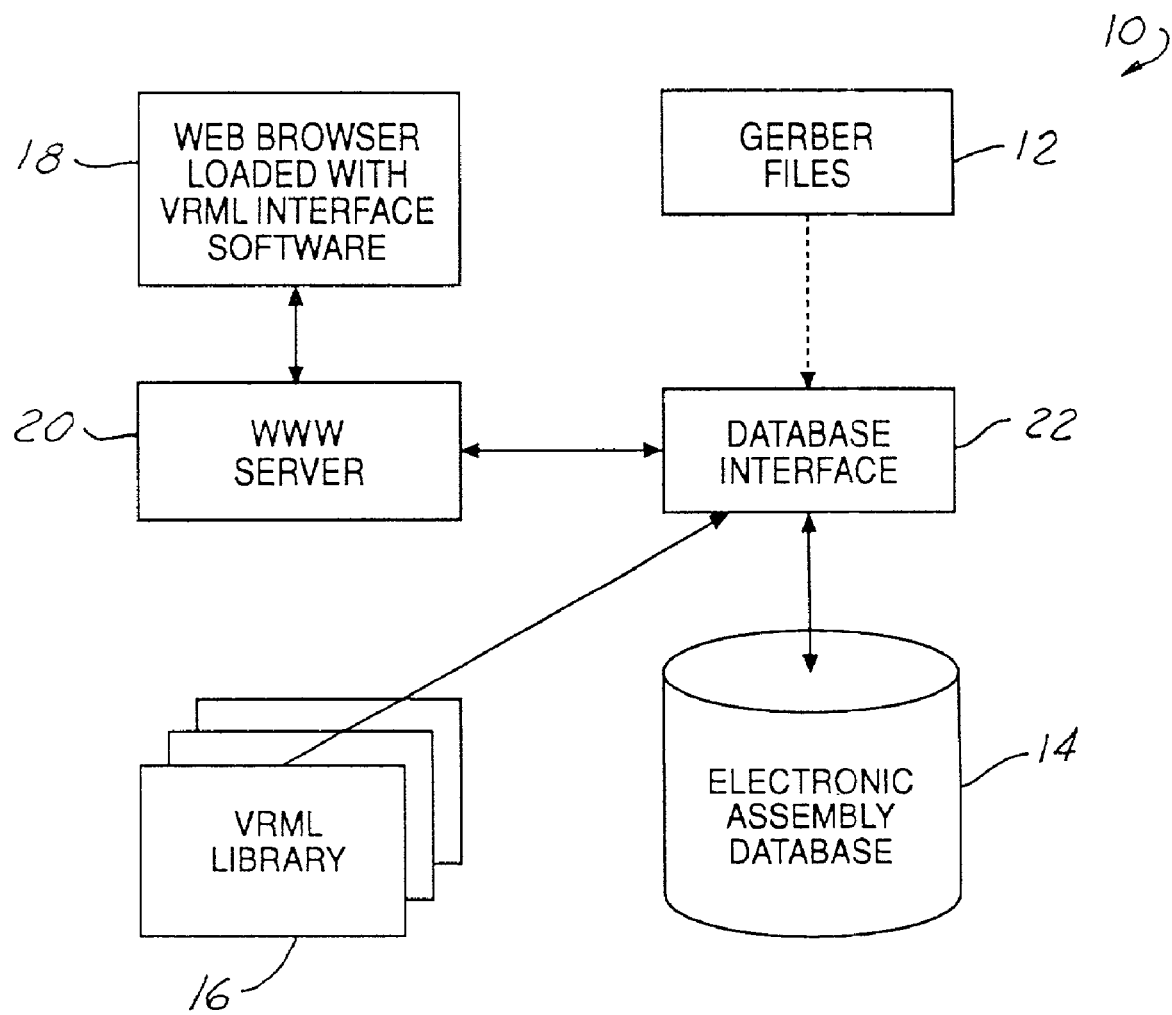
FIG. 1 illustrates the full architecture of a system incorporating a VRML interface software program in accordance with one embodiment of the present invention.

The present invention illustrates a VRML interface software program particularly suited for the printed circuit board (PCB) assembling environment. However, the present invention also applies to various other uses that may require a VRML interface software program.

Referring to FIG. 1, an illustration of the full architecture 10 of a system incorporating a VRML interface software program in accordance with one embodiment of the present invention is shown. The figure shows three separate external databases to which a printed circuit board (PCB) assembler connects to gather information regarding component placement on a PCB. One skilled in the art; however, would realize that this system is not limited to three external databases.

The first database 12 houses Gerber image files, which are drawings composed utilizing Gerber drafting software. Typically, these Gerber images contain information regarding PCB artwork, which consists of all traces and paths made on a PCB, the package dimensions of components, such as resistors, that will be placed on the PCB and can also contain mechanical drawings if the assembled PCB is mounted on a mechanical part. The Gerber files may also contain information about the circuit layout of pads, which illustrates the portions of the artwork that come into physical contact with the components. The circuit layout of pads provides the PCB assembler with a refined understanding of the connections that must be made during the assembly process.

The electronic assembly database 14 typically contains information saved in a neutral file format regarding the geometric physical locations of components, such as resistors or microchips, on the PCB. However, from this physical layout of the PCB alone, it is not possible to distinguish like components, such as a 100 Ω resistor from a 1K Ω resistor, because their physical geometry is the same but their values are not part of this file set in the database. This database 14 may also contain the PCB outline and a bill of materials.

Finally, the VRML library database 16 is partially comprised of package type images that are typically drawn using CAD-based software. Package type images visually describe specific component attributes. For example, a package type image for an HC1202 chip may show the physical arrangement of the chip's eight pins and briefly indicate the functions each specific pin provides, i.e. pin 5 is the logical AND output of input pin 1 and input pin 2. The VRML library database 16 may also contain fiducial information. Fiducial information or fiducial marks include printed artwork features that are created in the same process as circuit artwork, Fiducial marks provide common measurable points for all steps in the assembly process. The fiducial information is included in the database 16 to provide a PCB assembler with 2D coordinate location information for components to be assembled on the PCB, such as a common point to serve as a reference designator by which other components are assembled. A reference designator is, for example, the coordinate (0,0), which typically serves as the origin for a grid and other 2D coordinate location information points, such as (3,4), which can be located once this origin is established. In addition, this database 16 can contain the coordinates of every component's location and rotation on the PCB. Each component's rotation information may include the coordinate references for a location on a plane and each component's size, shape, and relation to other components, such that a maximum number of components may fit in a designated area as a function of coordinating the components and their respective rotation information.

A PCB assembler requires all of the information contained in the above three databases to assemble the PCB. One skilled in the art would realize that the PCB assembling information need not be stored in the particular database as described above; instead, the database structure can vary without departing from the invention. To access this PCB assembling information, the PCB assembler will log onto the World Wide Web (WWW) using a locally installed web browser 18, such as Netscape, where VRML interface software has been installed onto the browser 18. The PCB assembler the will use the VRML interface software to make a request for a view of a specific PCB or a portion of a PCB. The VRML interface software will submit this request to the WWW server 20, which will, in turn, submits the request to a database interface 22, such as common gateway interface (CGI) or a Java Applets routine.

The database interface 22 retrieves the relevant information, regardless of what software platform was used to create the data, from the appropriate external databases 12, 14 and 16. Then the database interface 22 provides the VRML interface software with the raw data the PCB assembler requested and generates a new image. This new image combines all of the data from the varying databases 12, 14 and 16 into a neutral image file format, such as JPEG or GIF, that can be viewed on any computer independent from processor type.

From the foregoing, a new method to generate a VRML image based on software-specific images is brought to the art. The preferred embodiment's preceding description merely illustrates one of the many specific applications of the principles utilized in the present invention. Clearly, numerous and other arrangements can be evident to those skilled in the art without departing from the scope of the invention as defined by the following claims.

What is claimed is:

1. A virtual reality modeling language (VRML) interface computer device for printed circuit board (PCB) manufacturing comprising:
   a World Wide Web browser wherein said browser includes a VRML viewer plug-in;
   at least one external database comprising a reference designator, an X and Y location, rotation information, and package type for each of a plurality of components wherein said reference designator, said X and Y location, said rotation information, and said package type are created on differing software platforms, said reference designator, said X and Y location rotation information, and package type are partially comprised of Gerber images and partially comprised of CAD images; and
   a VRML interface software program installed onto said browser wherein said program compiles visual information from said reference designator, said X and Y location, said rotation information, and said package type and said VRML viewer plug-in and creates a neutral image file based on said reference designator, said X and Y location, said rotation information, and said package type, wherein said neutral image file can be viewed independent of computer platform.

2. The device as recited in claim 1 further comprising a database interface to communicate between said browser and said at least one external database.

3. The device as recited in claim 2 wherein said database interface is a common gateway interface (CGI).

4. The device as recited in claim 2 wherein said database interface is an applets routine.

5. The device as recited in claim 1 wherein said neutral image files comprise a JPEG format that can be viewed independent of computer platform.

6. The device as recited in claim 1 wherein said neutral image files comprise a GIF format that can be viewed independent of computer platform.

7. A virtual reality modeling language (VRML) interface system for printed circuit board (PCB) manufacturing comprising:
   a World Wide Web browser wherein said browser includes a VRML viewer plug-in;
   at least one external database storing a reference designator, an X and Y location, rotation information, and package type for each of a plurality of components wherein said reference designator, said X and Y location, said rotation information, and said package type for each of said plurality of components are created on differing software platforms, said reference designator, said X and Y location, rotation information, and package type are partially comprised of Gerber images of PCB artwork and are partially comprised of CAD images of electronic components used in assembling said PCB;
   a VRML interface software program installed onto said browser wherein said program compiles visual information from said reference designator, said X and Y location, said rotation information, and said package type for each of said plurality of components and creates a neutral image file based on said reference designator, said X and Y location, said rotation information, and said package type for each of said plurality of components wherein said neutral image file can be viewed independent of computer platform; and a printed circuit board (PCB) assembly facility wherein assembly operators assemble PCBs from said neutral image file.

8. The system as recited in claim 7 further comprising a database interface to communicate between said browser and said at least one external database.

9. The system as recited in claim 8 wherein said database interface is a common gateway interface (CGI).

10. The system as recited in claim 8 wherein said database interface is an applets routine.

11. The system as recited in claim 7 wherein said reference designator, said X and Y location, rotation information, and package type are partially comprised of a VRML database.

12. The system as recited in claim 11 wherein said VRML database is partially comprised of fiducials.

13. The system as recited in claim 11 wherein said VRML database is partially comprised of package type information for components to be assembled on said PCB.

14. The system as recited in claim 7 wherein said neutral image files are composed in a JPEG format that can be viewed independent of computer platform.

15. The system as recited in claim 7 wherein said neutral image files are composed in a GIF format that can be viewed independent of computer platform.

16. A method for printed circuit board (PCB) manufacturing including generating a neutral image file based on a reference designator, an X and Y location, rotation information, and package type for each of a plurality of components created from differing software platforms comprising the steps of:

assembling at least one external database that contains said reference designator, said X and Y location, said rotation information, and package type for each of said plurality of components created from differing software platforms, said reference designator, said X and Y location rotation information and package type are partially comprised of Gerber images of PCB artwork and are partially comprised of CAD images of electronic components used in assembling said PCB;

loading a VRML interface software program onto a World Wide Web (WWW) browser wherein said program compiles visual information from said reference designator, said X and Y location, said rotation information, and said package type for each of said plurality of components and creates a neutral image file based on said reference designator, said X and Y location, said rotation information, and said package type for each of said plurality of components wherein said neutral image file can be viewed independent of computer platform;

accessing a WWW server by using said WWW browser and using a database interface to access said reference designator, said X and Y location, said rotation information, and said package type for each of said plurality of components; and downloading said reference designator, said X and Y location, said rotation information, and said package type for each of said plurality of components and using said VRML interface software program to generate said neutral image file.

17. The method as recited in claim 16 further comprising the step of viewing said neutral image file by utilizing said WWW browser wherein a VRML viewer plug-in is loaded onto said browser.

* * * * *